(12) United States Patent
McIntyre et al.

(10) Patent No.: US 6,387,791 B1
(45) Date of Patent: May 14, 2002

(54) METHOD FOR MANUFACTURING MICROSCOPIC CANALS WITHIN A SEMICONDUCTOR

(75) Inventors: Tom J. McIntyre, Nokesville; Tuyet T. Bach, Manassas; Andrew TS Pomerene, Leesburg, all of VA (US)

(73) Assignee: BAE Systems, Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/737,636

(22) Filed: Dec. 14, 2000

(51) Int. Cl.[7] ................................. H01L 21/44
(52) U.S. Cl. .................. 438/597; 438/633; 438/648
(58) Field of Search .................. 438/645, 648, 438/683, 626, 633, 639, 597; 204/600; 235/287.2, 288.5, 301.3

(56) References Cited

U.S. PATENT DOCUMENTS 5,858,188 A * 1/1999 Soane et al. ............... 204/454
6,086,825 A * 7/2000 Sundberg et al. .......... 422/100
6,306,761 B1 * 10/2001 Taguchi .................... 438/646
6,329,282 B1 * 12/2001 Hsu et al. .................. 438/625
2001/0024820 A1 * 9/2001 Mastromatteo et al. .. 435/287.2

* cited by examiner

Primary Examiner—Tuan H. Nguyen
(74) Attorney, Agent, or Firm—Antony P. Ng; Bracewell & Patterson, L.L.P.

(57) ABSTRACT

A method for manufacturing microscopic canals within a semiconductor is disclosed. A shallow trench is initially formed on a substrate using a patterned photoresist. After the patterned photoresist has been removed from the substrate, a separation layer, such as a Titanium layer, is deposited on the substrate. Subsequently, a cap layer, such as a Titanium nitride layer, is deposited on the separation layer. Both the separation layer and the cap layer are then polished off from the surface of the substrate. Finally, a Tungsten layer is deposited on the substrate and in the trench such that a microcanal will be formed within the trench as a result.

15 Claims, 6 Drawing Sheets

METHOD FOR MANUFACTURING MICROSCOPIC CANALS WITHIN A SEMICONDUCTOR

BACKGROUND OF THE INVENTION

1. Technical Field

The present invention relates to manufacturing integrated circuit devices in general, and in particular to manufacturing microfluidic devices. Still more particularly, the present invention relates to a method for manufacturing microscopic canals within a semiconductor integrated circuit device.

2. Description of the Prior Art

Microfluidic devices are semiconductor devices that make use of both the electrical properties of semiconductor substrates and the chemical properties of liquids or gases. Some microfluidic devices contain microscopic canals (or microcanals) with diameters at submicron level. Such microscopic canals allow liquids or gases to flow within a microfluridic device or to flow from one microfluridic device to another. Microfluidic devices having microscopic canals may find applications in optical waveguide, micropneumatics, microhydraulics, etc.

The present disclosure provides a method for manufacturing microscopic canals within a semiconductor integrated circuit device.

SUMMARY OF THE INVENTION

In accordance with a preferred embodiment of the present invention, a shallow trench is initially formed in a substrate using a patterned photoresist. After the patterned photoresist has been removed from the substrate, a separation layer, such as a Titanium layer, is deposited on the substrate. Subsequently, a cap layer, such as a Titanium nitride layer, is deposited on the separation layer. Both the separation layer and the cap layer are then polished off from the surface of the substrate. Finally, a Tungsten layer is deposited on the substrate and in the trench such that a microcanal will be formed within the trench as a result.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
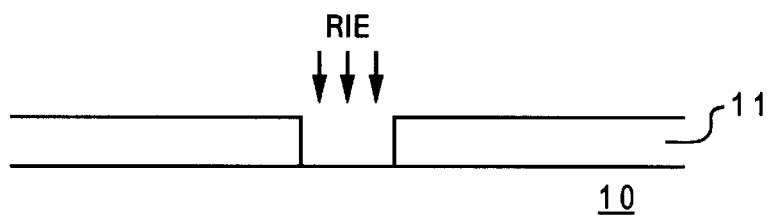
FIGS. 1a–1f are pictorial representations of a process for making a microcanal within a silicon wafer, in accordance with a preferred embodiment of the present invention.
Figure 1B:
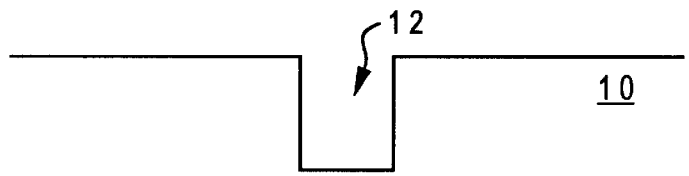

Referring now to the drawings and in particular to FIG. 1a, there is depicted a silicon substrate 10 in which a microcanal will be built in accordance with a preferred embodiment of the present invention. First, a shallow trench is formed on substrate 10 by using a patterned photoresist along with standard lithography and etch procedures that are well-known in the art. For example, a layer of photoresist 11 is deposited on top of substrate 10 and a reactive-ion etch (RIE) procedure is performed on substrate 10 after photoresist 11 has been patterned. After photoresist 11 has been removed from substrate 10, substrate 10 is left with a trench 12, as shown in FIG. 1b. The dimension of trench 12 is approximately 0.5 $\mu$m wide by 1.0 $\mu$m deep.

Figure 1C:
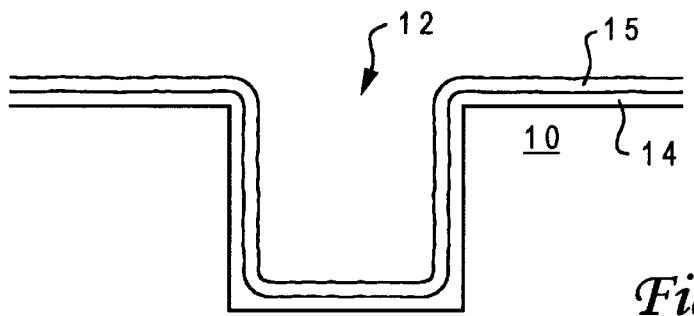

Next, a separation layer, such as a Titanium layer 14, is deposited on substrate 10. Titanium layer 14, preferably 400 Å thick, should conform with the contour of trench 12, as shown in FIG. 1c. A cap layer, such as a Titanium nitride layer 15, is then deposited on top of Titanium layer 14. Titanium nitride layer 15, preferably 200 Å thick, should also conform with the contour of trench 12, as depicted in FIG. 1c. In order to obtain the thicknesses of 400 Å for Titanium layer 14 and 200 Å for Titanium nitride layer 15 on the sidewalls of trench 12, 800 Å of Titanium and 600 Å of Titanium nitride are deposited, respectively, on a planar surface.

Figure 1D:
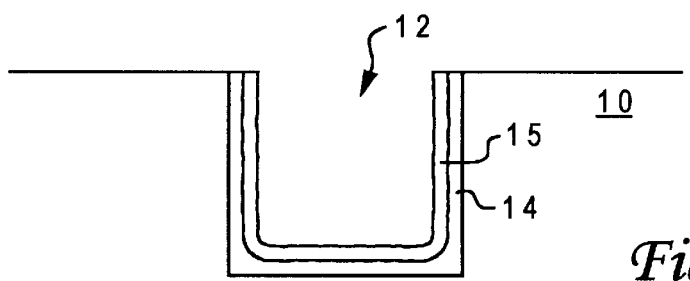

Subsequently, both Titanium layer 14 and Titanium nitride layer 15 are polished off the surface of substrate 10 by using any chemical-mechanical polishing (CMP) technique that is well-known in the art. The remaining structure of trench 12 is open in the middle, as illustrated in FIG. 1d, with Titanium layer 14 and Titanium nitride layer 15 conforming to the sidewalls of trench 12.

A Tungsten layer 16 is then deposited on substrate 10 via a chemical vapor deposition (CVD) process. During the CVD process, the reactant gases begins to "attack" Titanium layer 14 (not Titanium nitride layer 15) on the sidewalls of trench 12, and separates the Titanium liner from the sidewalls of trench 12. The chemistry of the CVD process is as follows:

$$3SiH_4+2WF_6 \rightarrow 2W+3SiH_4+6H_2\uparrow \qquad (1)$$

$$3H_2+WF_6 \rightarrow W+6HF \qquad (2)$$

Figure 1E:
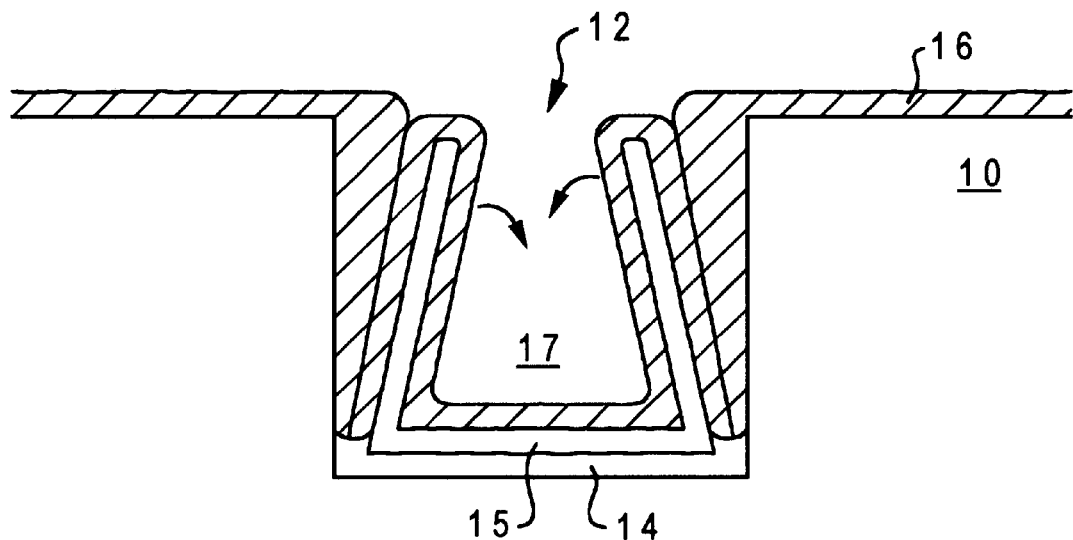
Figure 1F:
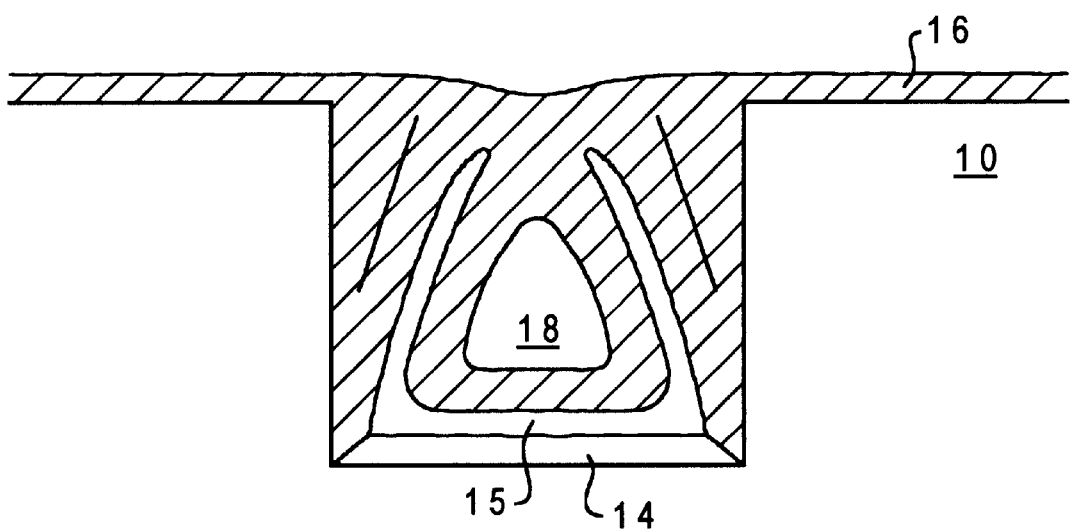

Equation (1) depicts the initial nucleation step (seed layer) of the Tungsten in Tungsten layer 16. Then, the chemical process transitions into a second gas mixture for the Tungsten-fill that is depicted by equation (2). It is during the Tungsten-fill step when Hydrogen Fluoride (HF) is formed and Titanium layer 14 is being attacked, resulting in the separation of both Titanium layer 14 and Titanium nitride layer 15 from the sidewalls of trench 12. When the Titanium in Titanium layer 14 is being attacked, the interface between the Titanium and the silicon dioxide of the sidewalls is weakened, which then leads to the separation of Titanium layer 14 and Titanium nitride layer 15 from the sidewalls. After the initial attack, as shown in FIG. 1e, Tungsten layer 16 further collapses both Titanium layer 14 and Titanium nitride layer 15 into the center of trench 12 (according to the directions of arrows) so that a triangular void 17 begins to form within trench 12. Tungsten is continue to be deposited, and eventually Tungster layer 16 seals off trench 12 (or specifically void 17) to form a microcanal 18, as depicted in FIG. 1f.

Figure 2:
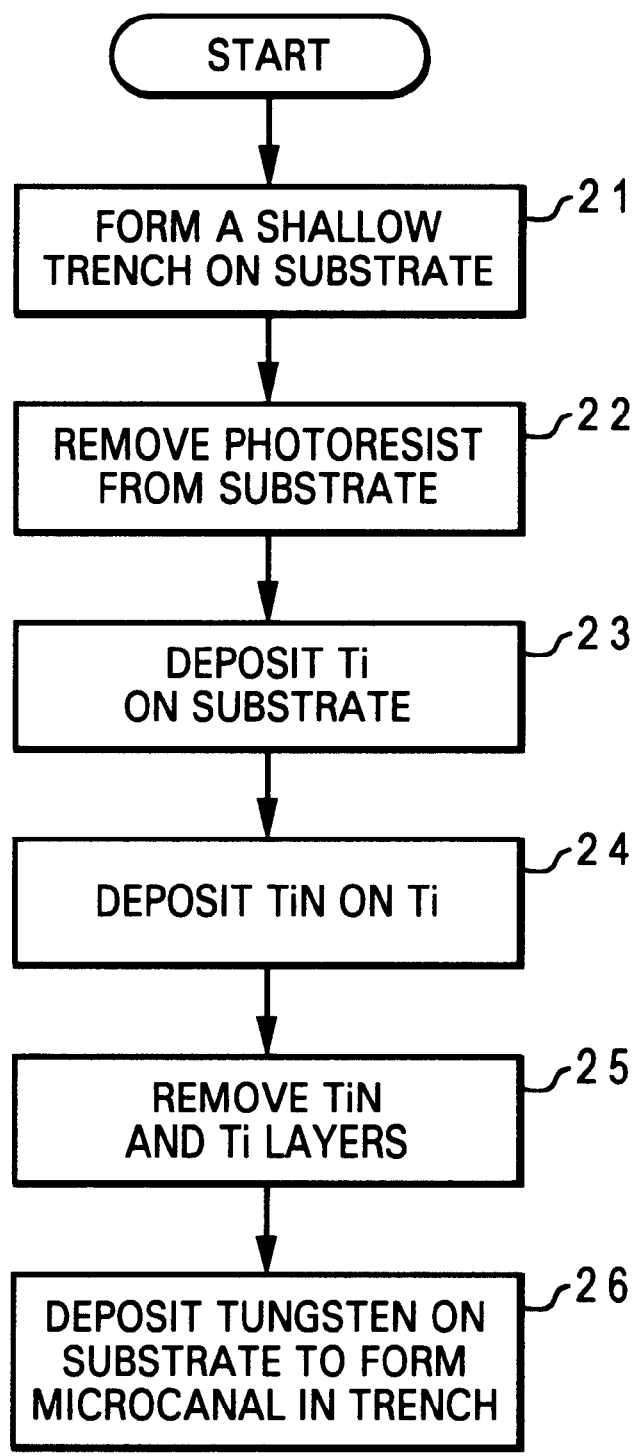
FIG. 2 is a high-level process flow diagram of a method for manufacturing the microcanal from FIGS. 1a–1f, in accordance with a preferred embodiment of the present invention.

With reference now to FIG. 2, there is depicted a high-level process diagram of a method for manufacturing a microcanal, such as microcanal 18, within a semiconductor substrate, in accordance with a preferred embodiment of the present invention. First, a shallow trench is formed on a substrate, as shown in block 21, by using a patterned photoresist along with standard lithography and etch practices that are well-known in the art. Then, the patterned photoresist is removed to expose a trench within the substrate, as depicted in block 22. Next, a separation layer, such as a Titanium layer, is deposited on the substrate, as illustrated in block 23. The Titanium layer conforms with the contour of the trench. A cap layer, such as a Titanium nitride layer, is then deposited on top of the Titanium layer, as depicted in block 24. The Titanium nitride layer also conforms with the contour of the trench. Both the Titanium layer and the Titanium nitride layer are then polished off the surface of the substrate by using a CMP procedure, as illustrated in block 25. Next, a Tungsten layer is deposited on the substrate via a CVD process such that a microcanal can be formed within the trench, as shown in block 26.

Figure 3A:
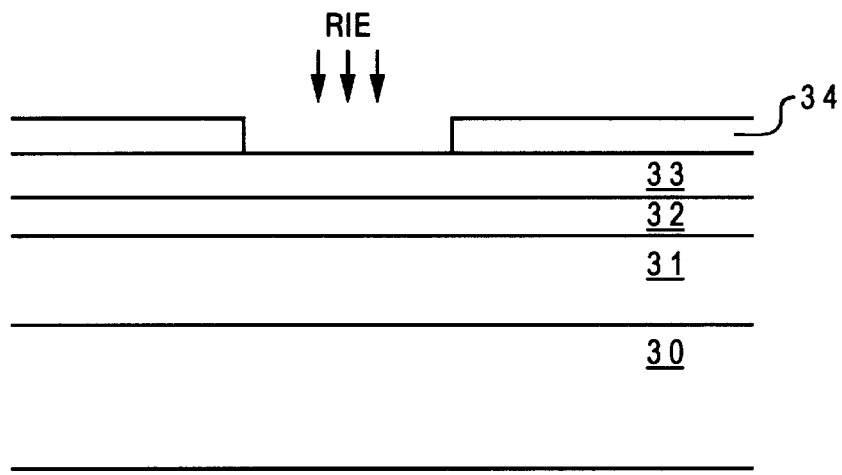
FIGS. 3a–3e are pictorial representations of a process for making a microcanal within a silicon wafer, in accordance with an alternative embodiment of the present invention.

Referring now to FIG. 3a, there is depicted a silicon substrate 30 in which a microcanal will be built in accordance with an alternative embodiment of the present invention. First, an undoped silicon dioxide ($SiO_2$) layer 31 is deposited on substrate 30. Then, a 10%–5% phosphorus glass layer 32 and an undoped silicon dioxide layer 33 are deposited on silicon dioxide layer 31. Subsequently, a shallow trench is formed within layers 31, 32, and 33 by using a patterned photoresist along with standard lithography and etch procedures that are well-known in the art. For example, a layer of photoresist 34 is deposited on top of silicon dioxide layer 33, and a RIE procedure is performed on layers 31, 32, and 33 after photoresist 34 has been patterned.

Figure 3B:
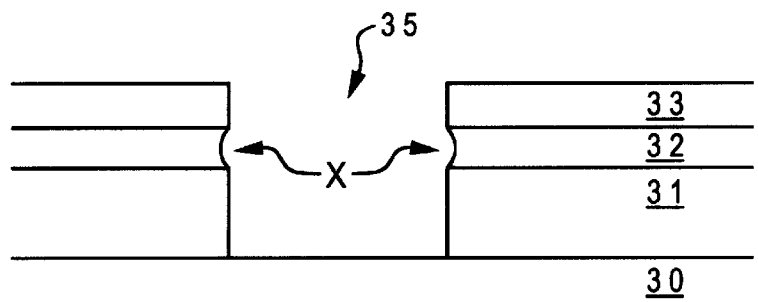

Photoresist 34 is then removed, and a trench 35 is formed within layers 31, 32, and 33, as shown in FIG. 3b. The dimension of trench 35 is approximately 0.5 µm wide by 1.0 µm deep. Because the rate of etching is relatively faster in phosphorus glass layer 32 than in silicon dioxide layers 31 and 33, phosphorus glass layer 32 is etched deeper than silicon dioxide layers 31 and 33. Such deeper etch is shown as notches x in FIG. 3b.

Figure 3C:
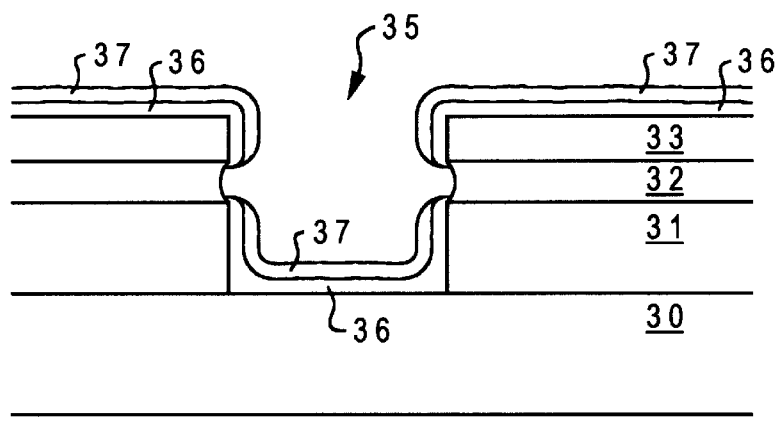

Next, a separation layer, such as a Titanium layer 36, is deposited on silicon dioxide layer 33 and in trench 35. Except in phosphorus glass layer 32, Titanium layer 36, preferably 400 Å thick, should conform with the contour of trench 35, as shown in FIG. 3c. A cap layer, such as a Titanium nitride layer 37, is then deposited on top of Titanium layer 36. Except in phosphorus glass layer 32, Titanium nitride layer 37, preferably 200 Å thick, should also conform with the contour of trench 35, as depicted in FIG. 3c. Thus, there is a "break" in phosphorus glass layer 32 for both Titanium layer 36 and Titanium nitride layer 37.

Figure 3D:
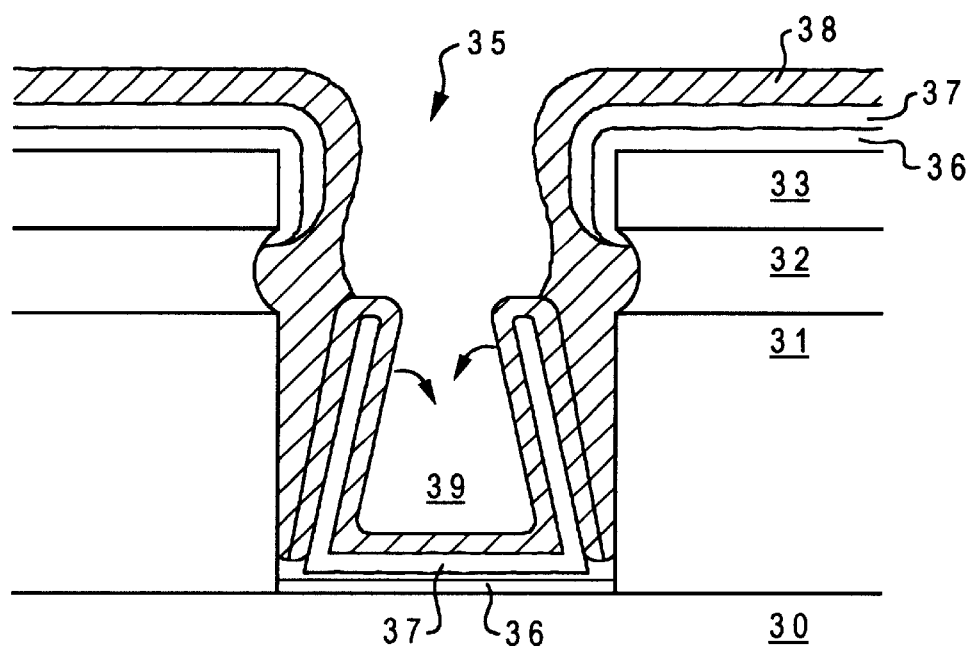
Figure 3E:
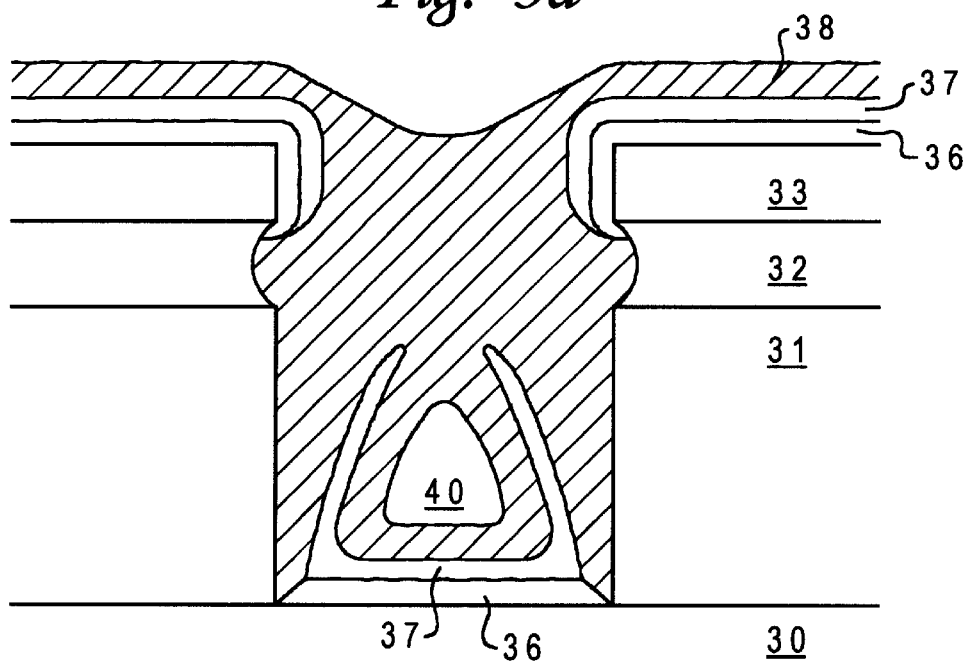

Subsequently, a Tungsten layer 38 is deposited in trench 35 via a CVD process, as mentioned above. During the CVD process, the reactant gases during Tungsten deposition begins to "attack" Titanium layer 36, and separates both Titanium layer 36 and Titanium nitride layer 37 from the sidewalls of trench 35. Tungsten layer 38 further collapses Titanium layer 36 and Titanium nitride layer 37 into the center of trench 35 so that a triangular void 39 begins to form, as shown in FIG. 3d. Tungsten is continue to be deposited in trench 35, and Tungsten layer 38 eventually seals off trench 35 (or specifically void 39) to form a microcanal 40, as depicted in FIG. 3e.

Instead of Tungsten, chalcogenide may also be used to seal off trench 35 for forming microcanal 40. If chalcogenide is used, the color of chalcogenide can turn bright (i.e., a polycrystalline state) or dark (i.e., an amorphous state), and such color-changing property can be used as on and off signals in optical waveguide applications.

Figure 4:
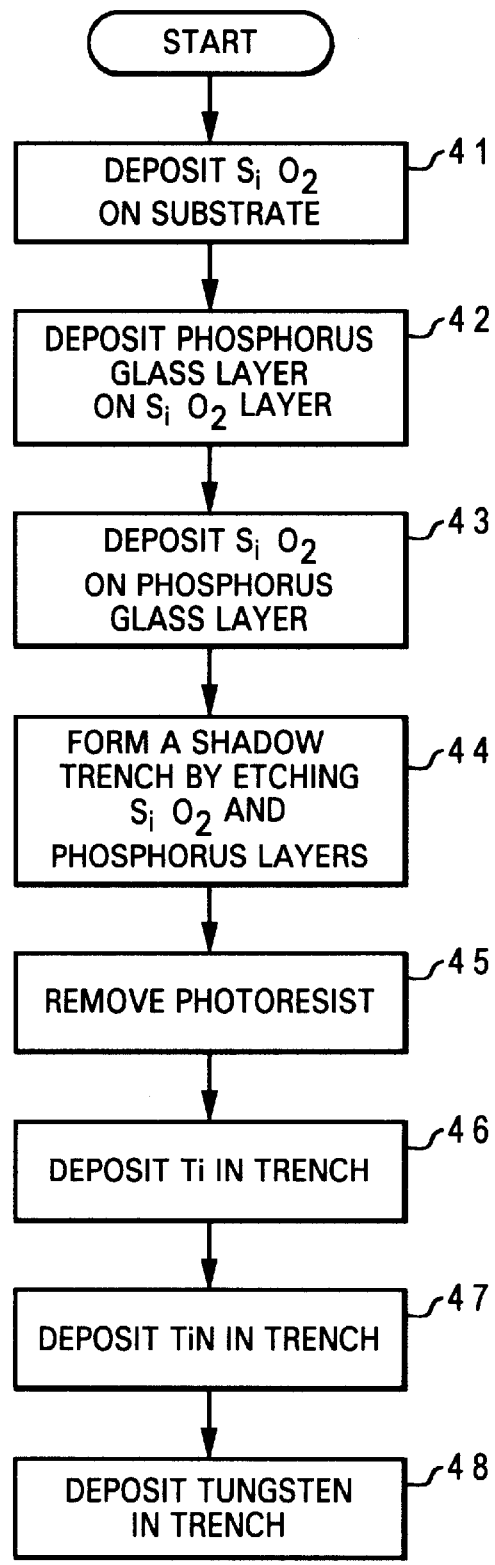
FIG. 4 is a high-level process flow diagram of a method for manufacturing the microcanal from FIGS. 3a–3e, in accordance with an alternative embodiment of the present invention.

With reference now to FIG. 4, there is depicted a high-level process diagram of a method for manufacturing a microcanal, such as microcanal 40, on a semiconductor substrate, in accordance with an alternative embodiment of the present invention. First, an undoped silicon dioxide layer is deposited on a substrate, as shown in block 41. Then, a 10%–5% phosphorus glass layer is deposited on the silicon dioxide layer, as depicted in block 42, and a second undoped silicon dioxide layer is deposited on the phosphorus glass layer, as illustrated in block 43. Subsequently, a shallow trench is formed within the phosphorus glass layer and the two silicon dioxide layers, by using a patterned photoresist along with standard lithography and etch procedures that are well-known in the art.

Subsequently, the patterned photoresist is removed to expose the trench, as shown in block 45. Next, a separation layer, such as a Titanium layer, is deposited in the trench, as illustrated in block 46. The Titanium layer conforms with the contour of the trench. A cap layer, such as a Titanium nitride layer, is then deposited on top of the Titanium layer, as depicted in block 47. The Titanium nitride layer also conforms with the contour of the trench. A Tungsten layer is then deposited in the trench such that a microcanal can be formed within the trench, as shown in block 48.

As has been described, the present invention provides an improved method of manufacturing microcanals within a semiconductor. Microcanals can be used in a micromachine fashion to deliver air for pneumatics, vacuum for vacuum actuators, or liquid for hydraulics.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing a microcanal within a semiconductor substrate, said method comprising:
   forming a shallow trench in a substrate using a patterned photoresist;
   removing said patterned photoresist to expose said trench within said substrate;
   depositing a separation layer on said substrate;
   depositing a cap layer on said separation layer;
   polishing said separation layer and said cap layer off from a surface of said substrate; and
   depositing a Tungsten layer on said substrate and in said trench such that a microcanal is formed within said trench as a result.

2. The method of claim 1, wherein said separation layer is a Titanium layer.

3. The method of claim 1, wherein said cap layer is a Titanium nitride layer.

4. The method of claim 1, wherein said polishing step further includes a step of polishing said separation layer and said cap layer off from said substrate by using a chemical-mechanical polishing procedure.

5. The method of claim 1, wherein said separation layer is approximately 200–400 Å thick on sidewalls of said trench.

6. The method of claim 1, wherein said cap layer is approximately 100–200Å thick on sidewalls of said trench.

7. The method of claim 1, wherein said depositing a Tungsten layer further includes a step of depositing a Tungsten layer via a chemical vapor deposition process.

8. The method of claim 1, wherein said depositing a Tungsten layer further includes a step of depositing a chalcogenide layer.

9. A method for manufacturing a microcanal on a semiconductor substrate, said method comprising:

depositing a first silicon oxide layer on a substrate;

depositing a phosphorus glass layer on said first silicon oxide layer;

depositing a second silicon oxide layer on said phosphorus glass layer;

forming a shallow trench in said first silicon oxide layer, said phosphorus glass layer, and said second silicon oxide layer using a patterned photoresist;

removing said patterned photoresist to expose said trench;

depositing a separation layer in said trench;

depositing a cap layer on said separation layer; and depositing a Tungsten layer in said trench such that a microcanal is formed within said trench as a result.

10. The method of claim 9, wherein said separation layer is a Titanium layer.

11. The method of claim 9, wherein said cap layer is a Titanium nitride layer.

12. The method of claim 9, wherein said separation layer is approximately 200–400 Å thick on sidewalls of said trench.

13. The method of claim 9, wherein said cap layer is approximately 100–200 Å thick on sidewalls of said trench.

14. The method of claim 9, wherein said depositing a Tungsten layer further includes a step of depositing a Tungsten layer via a chemical vapor deposition process.

15. The method of claim 9, wherein said depositing a Tungsten layer further includes a step of depositing a chalcogenide layer.

* * * * *